United States Patent
Westberg

(10) Patent No.: US 6,285,554 B1
(45) Date of Patent: Sep. 4, 2001

(54) METHOD AND AN ARRANGEMENT FOR THE ELECTRICAL CONTACT OF COMPONENTS

(75) Inventor: David Westberg, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/527,572

(22) Filed: Mar. 16, 2000

(30) Foreign Application Priority Data

Mar. 17, 1999 (SE) .................................... 9900962

(51) Int. Cl.[7] .................................................. H05K 7/20
(52) U.S. Cl. .................. 361/719; 361/704; 361/707; 361/709; 361/760; 361/712; 257/706; 257/707; 257/713; 174/51; 174/52.1; 174/252; 165/80.2; 165/185
(58) Field of Search ..................... 361/690, 702, 361/704, 707, 709, 717–721, 760, 761; 257/686, 685, 706, 707, 778; 165/80.3, 185; 174/16.3, 252

(56) References Cited

U.S. PATENT DOCUMENTS

| 4,855,867 | 8/1989 | Gazdik et al. . | |
| 4,868,349 | 9/1989 | Chia . | |
| 5,045,921 | 9/1991 | Lin et al. . | |
| 5,138,439 | 8/1992 | Kobiki . | |
| 5,170,931 | 12/1992 | Desai et al. . | |
| 5,297,006 | * 3/1994 | Mizukoshi | 361/704 |
| 5,517,753 | 5/1996 | Messina . | |
| 5,633,533 | * 5/1997 | Andros et al. | 257/707 |
| 5,724,230 | * 3/1998 | Poetzinger | 361/758 |
| 5,768,774 | * 6/1998 | Wilson et al. | 29/840 |
| 5,770,478 | 6/1998 | Iruvanti et al. . | |
| 5,786,635 | * 7/1998 | Alcoe et al. | 257/718 |
| 5,819,402 | 10/1998 | Edwards et al. . | |
| 5,825,087 | 10/1998 | Iruvanti et al. . | |
| 5,834,839 | * 11/1998 | Mertol | 361/709 |
| 5,854,507 | * 12/1998 | Miremadi et al. | 257/686 |
| 6,122,171 | * 9/2000 | Akram et al. | 361/704 |

\* cited by examiner

*Primary Examiner*—Leo P. Picard
*Assistant Examiner*—Boris L. Chervinsky
(74) *Attorney, Agent, or Firm*—Burns, Doane, Swecker & Mathis, L.L.P.

(57) ABSTRACT

A method and an arrangement for connecting a component, such as a chip (6), on a substrate (7) to a conductive surface of a carrier. The conductive surface can be an earth plane (10) and the carrier can be a printed circuit board. The method and arrangement allow the component to thermally conduct and/or electrically conduct onto the conductive surface.

18 Claims, 1 Drawing Sheet

METHOD AND AN ARRANGEMENT FOR THE ELECTRICAL CONTACT OF COMPONENTS

This application claims priority under 35 U.S.C. §§119 and/or 365 to 9900962-3 filed in Sweden on Mar. 17. 1999; the entire content of which is hereby incorporated by reference.

FIELD OF INVENTION

The present invention relates to a method for connecting a component, such as a chip or like component, to a conductive carrier surface, such as an earth plane on a printed circuit board or the like, in a compact design, and also to an arrangement for connecting a component so as to achieve conduction between said component and a carrier, such as between a chip and a printed circuit board, in a compact design.

DESCRIPTION OF THE BACKGROUND ART

It is known to mount substrate. 1 with chip 2 on printed circuit board 3. In compact designs, with a multi-layer ceramic carrier substrates, the discrete components/the chips are mounted on the underside of the substrate between said substrate and the printed circuit board, wherewith heat generated in the components can be transmitted solely to the substrate and from there to the circuit board and its various connections, such as contact pins or beads 4 of solder that melt at high temperatures located between the substrate and the printed circuit board. The connections function as electrical connections and as mechanical spacing means, this latter by virtue of being slightly larger than the remaining discrete components on the underside of the substrate. The components can be shielded by providing on the circuit board, immediately beneath the components, an earth plane 5 which, together with the earth plane of respective components, shields said components without the discrete components being in contact with the earth plane. The substrate-mounted components are liable to generate heat in operation, which in certain cases may be quite considerable. It is therefore important that the thermal contact achieved between the components/the chips and the printed circuit board with its wide copper surfaces is as effective as possible. Because none of the discrete components have direct contact with the circuit board, the major part of the heat generated in said components must be transferred to the circuit board via the substrate and the circuit board connections. In the case of ceramic substrates, the greatest temperature gradient occurs in the longitudinal direction of the substrate in these instances, because ceramics are relatively poor conductors of heat. Transistors in the components may well become damaged at excessively high temperatures, as a result of the poor thermal conductivity of the ceramic substrate.

SUMMARY OF THE INVENTION

With the intention of protecting a component, such as a chip, that is mounted on a ceramic substrate connected to a carrier, such as a printed circuit board, from damage as a result of the limited thermal conductivity of the ceramic, the chip has been connected directly to the circuit board with a thin layer that provides the absolute shortest path to the circuit board. Direct connection of the chip with the circuit board can be achieved by soldering the chip so that its height, which is critical, will be essentially the same as the height of the connections, and by mounting the rear side of the chip directly to the circuit board with a thin layer of adhesive or solder. An acceptable substrate earth can be obtained, by metallizing the rear side of the chip and making the connection between the rear side of the chip and the earth plane on the printed circuit board electrically conductive.

The invention will now be described in more detail with reference to preferred embodiments thereof and also with reference to the accompanying drawing.

DESCRIPTION OF PREFERRED EMBODIMENTS

Figure 1:
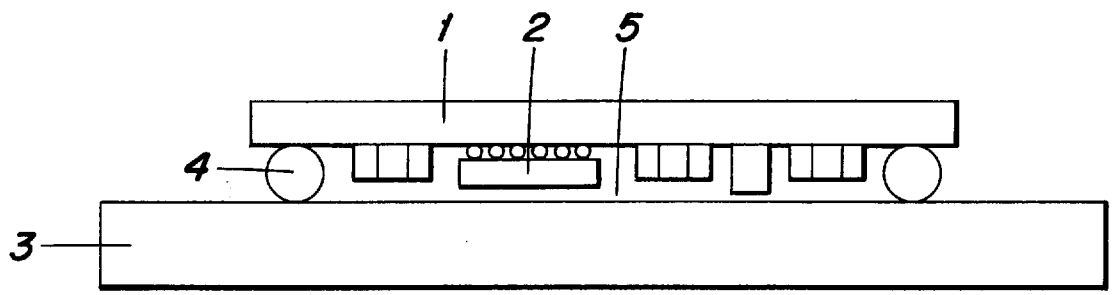
FIG. 1 shows a chip connected to a carrier-mounted substrate in accordance with known technology.
Figure 2:
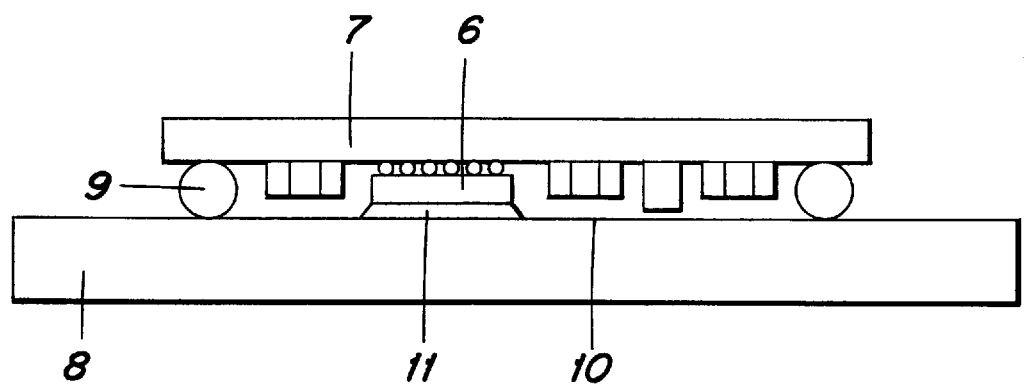
FIG. 2 shows a chip connected to a substrate which is mounted on and connected to a carrier in accordance with the invention.
Figure 3:
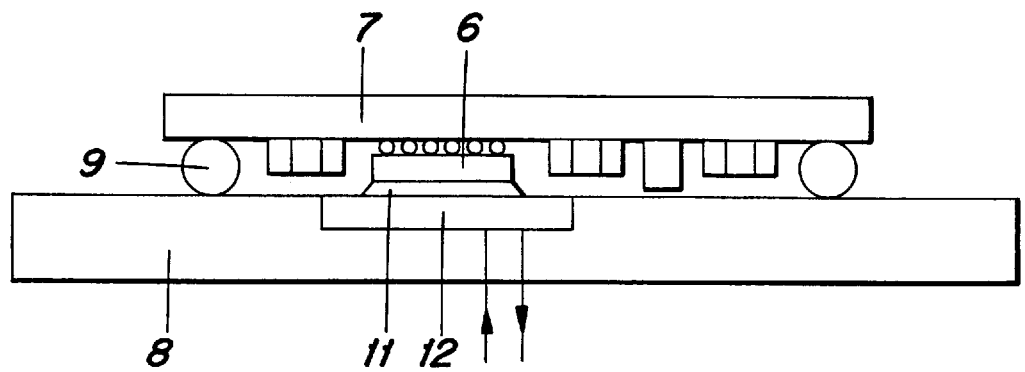
FIG. 3 shows a chip connected to a substrate mounted on and connected to a carrier-mounted cooling element in accordance with the invention.

In response to requirements for a compact design, such as a design which in respect of components is particularly created for embodiment in telephones or other similar applications, there has been created a new type of module in which discrete components/chips 6 have been mounted on the underside of a carrier substrate 7 that is comprised of several ceramic layers, between said substrate and a printed circuit board 8, so as to be in contact with said board. In this case, the connections between substrate and printed circuit board are also comprised of beads 9 of solder that melts at high temperatures. The beads function as electrical connections and also as mechanical spacing means, by virtue of being slightly larger than all other discrete components on the underside of the substrate. The printed circuit board may include immediately beneath the substrate-mounted chip an earth plane 10 which, together with the earth plane of the chip, electrically shields sensitive parts of the chip. With the intention of improving the thermal and electrical properties of the chip, the chip has been connected directly to the circuit board with the aid of a thin conductive layer 11, because of the limited thermal conductivity of the substrate ceramic. This provides the absolutely shortest thermal path to the circuit board. Direct connection of the chip can be achieved by adapting chip height, which may be critical, so that the height of the soldered chip will be almost the same as the height of the beads, or balls, and then fastening the rear side of the chip directly to the circuit board with a thin conductive layer of adhesive or solder. When the rear side of the chip is metallized and the connection between the rear side of the chip and the earth plane on the circuit board are made electrically conductive, there can be obtained, at the same time, effective substrate earthing of the chip. When the rear side of the chip/chips 6 is metallized and a conductive connection 11 to the circuit board 6 is provided, specific chip cooling elements 12 provided on or in the circuit board can be connected directly to the chip/chips.

Contact between chip and circuit board can conceivably be effected in chiefly two ways, either by gluing or soldering. In conjunction with soldering the module, the chip can be glued firmly in position by introducing some additional process steps, subsequent to having applied solder paste to the circuit board., by pressing for instance and after having dispensed adhesive to the circuit board where the chip is to be placed. The adhesive or glue used may conveniently be of a kind which will cure in conjunction with the re-melting process. No electrically conductive contact on the rear side of the chip is required in order to obtain solely thermal contact between chip and circuit board. However, a rear-side contact is required in contact with an electrically conductive adhesive, when effective substrate-earthing of the chip is required.

The chip can be soldered to the circuit board without requiring any additional process steps. It is necessary, however, that the chip has a solderable rear-side contact, and that the chip is fixed to the ceramic substrate with a bottom filling, so that there is no danger of the chip being moved out of its position when beads or balls of low-melting solder, so-called flipchip bumps, are re-melted. The soldering process per se is very simple, since an earth plane is already present beneath the chip/chips. All that may be required is to make an opening in the protective varnish present beneath the chip, and that a solder paste is also applied in this region.

It will be understood that the invention is not restricted to the aforedescribed and illustrated exemplifying embodiments thereof, and that modifications can be made within the scope of the accompanying Claims.

What is claimed is:

1. A method of improving the thermal and/or electrical properties of a chip connected to a substrate mounted on a printed circuit board, comprising the step of:

connecting the chip to a conductive surface on the printed circuit board by a conductive layer between the chip and the conductive surface on the printed circuit board.

2. A method according to claim 1, wherein the chip is connected to an earth plane on the printed circuit board by the conductive layer which comprises solder or an electrically conductive glue.

3. A method according to claim 1, wherein the chip is connected to a thermally conductive surface on the printed circuit board.

4. A method according to claim 1, wherein the chip is connected to the conductive surface on said printed circuit board by the conductive layer which comprises electrically conductive glue.

5. An arrangement for improving the thermal and/or electrical properties of a chip, the arrangement comprising:

the chip connected to a substrate mounted on a printed circuit board, wherein a conductive layer is provided between the chip and the printed circuit board for contact of the chip with a conductive surface on the printed circuit board.

6. An arrangement according to claim 5, wherein the conductive layer is an electrically conductive layer.

7. An arrangement according to claim 5, wherein the conductive layer is a thermally conductive layer.

8. An arrangement according to claim 6, wherein the conductive layer is arranged to connect the chip with an earth plane on the printed circuit board.

9. An arrangement according to claim 7, wherein the conductive layer is arranged to connect the chip to a cooling element on the printed circuit board.

10. An arrangement according to claim 6, wherein the conductive layer is arranged to connect the chip with an earth plane in the printed circuit board.

11. An arrangement according to claim 7, wherein the conductive layer is arranged to connect the chip to a cooling element in the printed circuit board.

12. An arrangement comprising:

a chip;
    a substrate, wherein the chip is connected to the substrate;
    a printed circuit board, wherein the chip is arranged to be placed directly above a conductive surface of the printed circuit board, and the chip is connected to the conductive surface.

13. The arrangement of claim 12, wherein the conductive surface is an electrically conductive surface and the chip is connected to the electrically conductive surface with solder or an electrically conductive glue.

14. The arrangement of claim 12, wherein the conductive surface is a thermally conductive surface.

15. The arrangement of claim 12, wherein the chip is glued to the conductive surface.

16. The arrangement of claim 12, wherein the conductive surface of the printed circuit board is an earth plane.

17. An arrangement comprising:

a component;
    a substrate, wherein the component is connected to the substrate;
    a printed circuit board, wherein the component is arranged to be in directly above an electrically and thermally conductive surface of the printed circuit board, and the component is connected to the conductive surface.

18. The arrangement of claim 17, wherein the component is connected to the conductive surface with a thin layer of adhesive or solder.

* * * * *